(12) United States Patent
Hiramoto (10) Patent No.: US 6,812,812 B2
(45) Date of Patent: Nov. 2, 2004

(54) LONGITUDINALLY COUPLED SURFACE ACOUSTIC WAVE RESONATOR FILTER

(75) Inventor: Masahiro Hiramoto, Kaga (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 60 days.

(21) Appl. No.: 10/279,954

(22) Filed: Oct. 25, 2002

(65) Prior Publication Data
US 2003/0090341 A1 May 15, 2003

(30) Foreign Application Priority Data
Oct. 25, 2001 (JP) ........................................ 2001-327755

(51) Int. Cl.[7] .................................................. H03H 9/64
(52) U.S. Cl. .................................. 333/195; 310/313 D
(58) Field of Search ................................ 333/193–196; 310/313 D (56) References Cited

U.S. PATENT DOCUMENTS

| | | | | |
|---|---|---|---|---|
| 5,392,013 A | * | 2/1995 | Yamamoto et al. | 333/195 |
| 5,559,483 A | * | 9/1996 | Kajihara et al. | 333/195 |
| 5,666,092 A | * | 9/1997 | Yamamoto et al. | 333/194 |
| 5,874,868 A | * | 2/1999 | Shimoe | 333/193 |
| 5,909,158 A | * | 6/1999 | Hiramoto | 333/195 |
| 5,986,524 A | * | 11/1999 | Shimoe | 333/195 |
| 6,154,105 A | * | 11/2000 | Fujimoto et al. | 333/194 |

FOREIGN PATENT DOCUMENTS

CN            1134626 A      10/1996

* cited by examiner

Primary Examiner—Barbara Summons
(74) Attorney, Agent, or Firm—Keating & Bennett, LLP (57) ABSTRACT

A longitudinally coupled surface acoustic wave resonator filter includes first and second interdigital transducers (IDTs) disposed on a quartz substrate and reflectors located on both sides of an area in which the first and second IDTs are located. A distance $L_1$ between the centers of the adjacent electrode fingers of the first and second IDTs satisfies equation (1):

$$(0.35+n/2)\lambda < L_1 < (0.55+n/2)\lambda \quad (1)$$

where n=0, 1, 2, 3 . . . , and
the distance $L_2$ between the center of the innermost electrode fingers of the reflectors and the center of the outermost electrode fingers of the adjacent IDTs satisfies equation (2):

$$(0.10+m/2)\lambda < L_2 < (0.40+m/2)\lambda \quad (2)$$

where m=0, 1, 2, 3 . . . .

14 Claims, 9 Drawing Sheets

LONGITUDINALLY COUPLED SURFACE ACOUSTIC WAVE RESONATOR FILTER

BACKGROUND OF THE INVENTION

1. Field of the Invention

The present invention relates to a longitudinally coupled surface acoustic wave resonator filter which is, for example, used as a bandpass filter in mobile communication systems and particularly to a longitudinally coupled surface acoustic wave resonator filter including a quartz substrate.

2. Description of the Related Art

The filter in the intermediate-frequency stage (IF stage) of mobile communication systems is required to have wider band characteristics due to digitization of the communication systems. Furthermore, in addition to the ability to resist changes due to temperature and to obtain sharp attenuation outside the passband, unnecessary spurious output is also required to be reduced.

Up to now, among such IF bandpass filters, surface acoustic wave resonator filters including a quartz substrate are known. Among such resonator filters, there are a longitudinally coupled surface acoustic wave resonator filter in which a plurality of interdigital transducers (hereinafter referred to as IDTs) are disposed between two reflectors along the propagation direction of a surface acoustic wave and a transversally coupled surface acoustic wave resonator filter in which two IDTs are disposed in a direction that is perpendicular to the propagation direction of a surface acoustic wave.

The longitudinally coupled surface acoustic wave resonator filter has an advantage in that it is easy to increase the bandwidth than the transversally coupled surface acoustic wave resonator filter.

However, in the longitudinally coupled surface acoustic wave resonator filter, there is a problem in that many unnecessary spurious outputs are generated in the bandpass characteristics.

Figure 8:
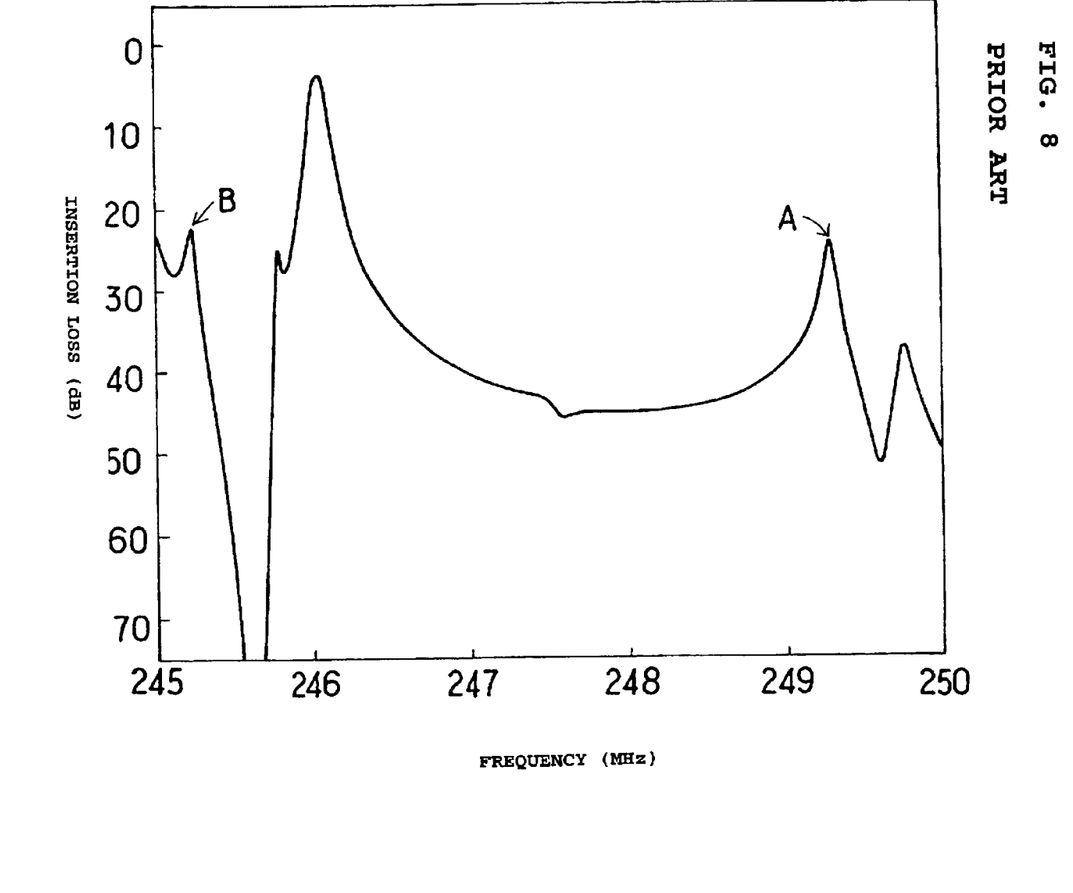
FIG. 8 shows the filtering characteristics of a related longitudinally coupled surface acoustic wave resonator filter.

FIG. 8 shows the filtering characteristics of a related longitudinally coupled surface acoustic wave resonator filter constructed by using a quartz substrate. In this surface acoustic wave resonator filter, the passband is 246±0.08 MHz, but, as shown by an arrow A, a large spurious output appears around 249.3 MHz or, and as shown by an arrow B, a spurious output also appears on the lower-frequency side of the passband on the opposite side of the spurious A. As a method for suppressing these spurious outputs A and B, so far the construction of multi-stage longitudinal connection is known. That is, it is known that the spurious outputs A and B can be suppressed by preparing a plurality of longitudinally coupled surface acoustic wave filters and having them longitudinally connected. However, in the construction of multi-stage longitudinal connection, there are various problems such as the increase of insertion loss, the increase in size of a piezoelectric substrate, a coil required for adjustment of the impedance between stages when the impedance of elements is capacitive, etc.

Figure 9A:
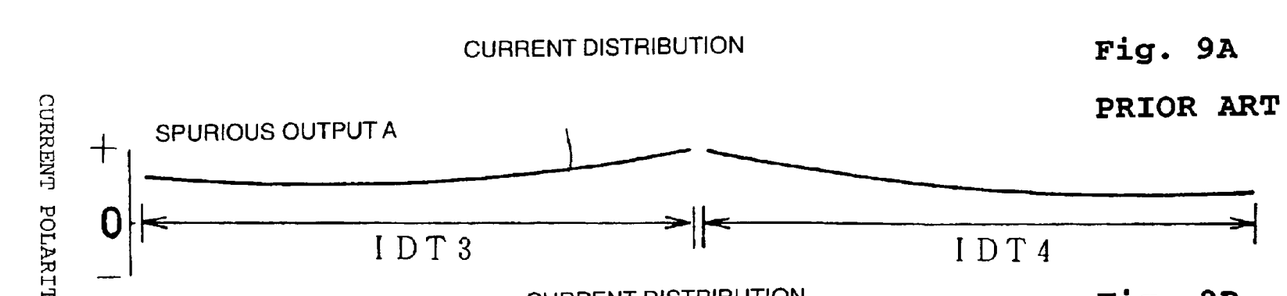
FIGS. 9A and 9B are schematic illustrations showing the current distribution flowing through IDTs at frequencies where spurious outputs A and B in FIG. 8 appear.
Figure 9B:
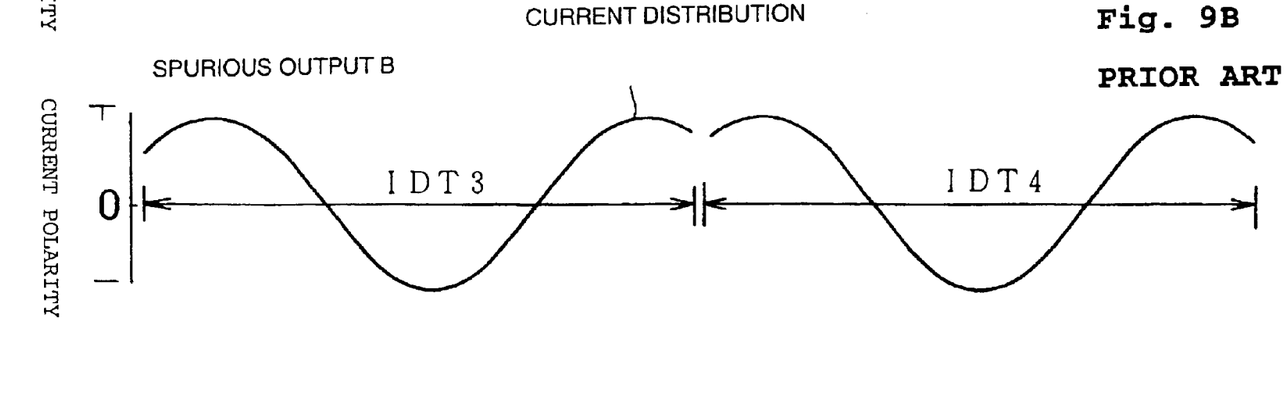

On the other hand, a method for suppressing spurious output by IDTs modified by weights can be also considered. Then, regarding the spurious outputs A and B, the distribution of effective current flowing through electrode fingers at each frequency is shown in FIGS. 9A and 9B. As clearly understood in FIG. 9B, in the case of the spurious output B, the portions in which the polarity of current is opposite to each other exists inside one IDT. Accordingly, it is understood that the current flowing inside one IDT can be canceled out by electrode fingers modified by weighting as in a method of thinning, etc.

However, as shown in FIG. 9A, at the frequency of spurious output A, only the current of the same polarity exists inside one IDT. Accordingly, it is very difficult to reduce the amplitude of the current at the frequency of spurious output A by modifying the current amplitude by weighting. That is, it is difficult to cancel out the above-described spurious output A by modification by weighting.

SUMMARY OF THE INVENTION

In order to overcome the problems described above, preferred embodiments of the present invention provide a longitudinally coupled surface acoustic wave resonator filter including a quartz substrate having excellent temperature stability in which the loss is greatly reduced and unnecessary spurious output is effectively prevented.

A longitudinally coupled surface acoustic wave resonator filter according to a preferred embodiment of the present invention includes a quartz substrate, a plurality of IDTs arranged along the propagation direction of a surface acoustic wave on the quartz substrate, and reflectors provided on both sides of an area in which the IDTs are provided in the propagation direction of a surface acoustic wave. In the longitudinally coupled surface acoustic wave resonator filter, the distance $L_1$ between the centers of the electrode fingers, which are the closest to each other, of adjacent interdigital transducers satisfies equation (1):

$$(0.35+n/2)\lambda < L_1 < (0.55+n/2)\lambda \qquad (1)$$

where n=0, 1, 2, 3 . . . , and the distance $L_2$ between the center of the innermost electrode fingers of the reflectors and the center of the outermost electrode fingers of the interdigital transducers adjacent to the reflectors satisfies equation (2):

$$(0.10+m/2)\lambda < L_2 < (0.40+m/2)\lambda \qquad (2)$$

where m=0, 1, 2, 3 . . . .

A longitudinally coupled surface acoustic wave resonator filter according to another preferred embodiment of the present invention includes two sets of the longitudinally coupled surface acoustic wave resonator filter according to the above-described preferred embodiment of the present invention, the two sets of the filters have different characteristics from each other, and are provided on the same quartz substrate, and the inputs and outputs of the two filters are electrically connected in parallel, respectively.

In a longitudinally coupled surface acoustic wave resonator filter of preferred embodiments of the present invention, the plurality of IDTs constitute first and second IDTs.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Hereinafter, longitudinally coupled surface acoustic wave resonator filters of preferred embodiments of the present invention are described in more detail with reference to the drawings.

Figure 1:
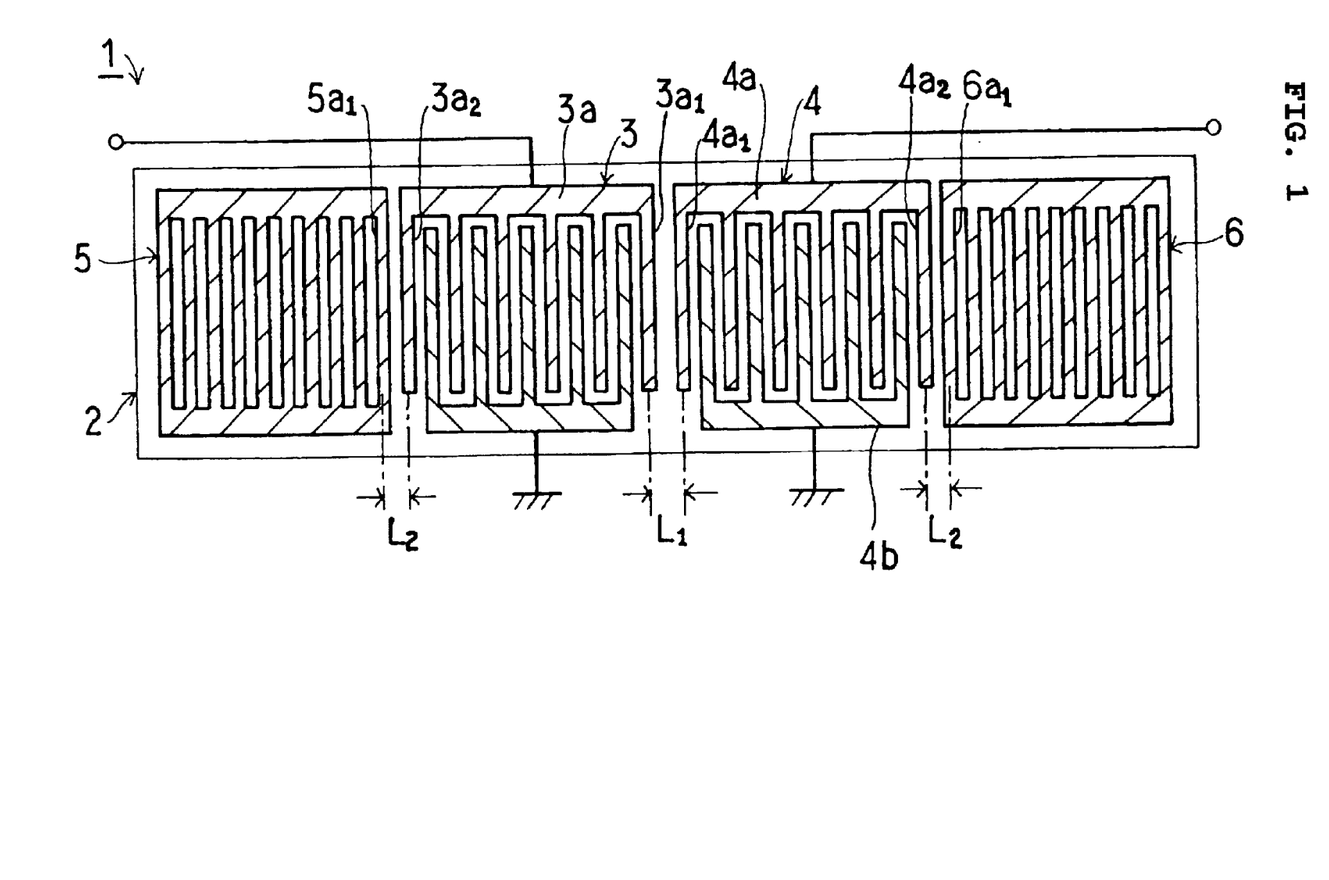
FIG. 1 is a top view of a longitudinally coupled surface acoustic wave resonator filter according to a first preferred embodiment of the present invention.

FIG. 1 is a top view of a longitudinally coupled surface acoustic wave resonator filter according to a first preferred embodiment of the present invention.

The longitudinally coupled surface acoustic wave resonator filter 1 preferably includes a substantially rectangular quartz substrate 2. This surface acoustic wave resonator filter 1 is constructed so that a surface acoustic wave may be propagated substantially parallel to the length direction of the substantially rectangular quartz substrate 2.

A first IDT 3 and a second IDT 4 are arranged along the direction in which a surface acoustic wave is propagated in the middle of the upper surface of the quartz substrate 2. Each of the IDTs 3 and 4 includes a pair of comb-shaped electrodes 3a, 3b, 4a, and 4b which are inserted into each other.

On the other hand, reflectors 5 and 6 are disposed on both sides, in the propagation direction of a surface acoustic wave, of the area where the first and second IDTs 3 and 4 are located. The reflectors 5 and 6 are preferably grating reflectors, and a plurality of electrode fingers are short-circuited at both ends.

In the surface acoustic wave resonator filter 1 of the present preferred embodiment, an input signal is applied to one comb-shaped electrode 3a of the IDTs. An output signal is taken out from one comb-shaped electrode 4a of the second IDT 4. Moreover, the comb-shaped electrodes 3b and 4b are grounded.

In the longitudinally coupled surface acoustic wave resonator filter 1 of the present preferred embodiment, the distance $L_1$ between the first and second IDTs is preferably in the range of approximately $(0.35+n/2)\lambda$ to $(0.55+n/2)\lambda$, and both of the distance $L_2$ between the IDT3 and the reflector 5 and the distance $L_2$ between the IDT4 and the reflector 6 is preferably in the range of approximately $(0.10+m/2)\lambda$ to $(0.40+m/2)\lambda$.

Moreover, in the above equations (1) and (2), n and m represent zero or an integer and λ represents the wavelength of an excited surface acoustic wave.

Furthermore, the distance between the IDTs 3 and 4 is defined as a distance between the centers of the electrode fingers $3a_1$ and $4a_1$ of the IDTs 3 and 4 which are the closest to each other. In the same way, the distance $L_2$ is defined as a distance between the centers of the outermost electrode fingers $3a_2$ of the IDT3 and the innermost electrode finger $5a_1$ of the reflector 5 and a distance between the centers of the outermost electrode fingers $4a_1$ of the IDT4 and the innermost electrode finger $6a_1$ of the reflector 6.

Figure 2:
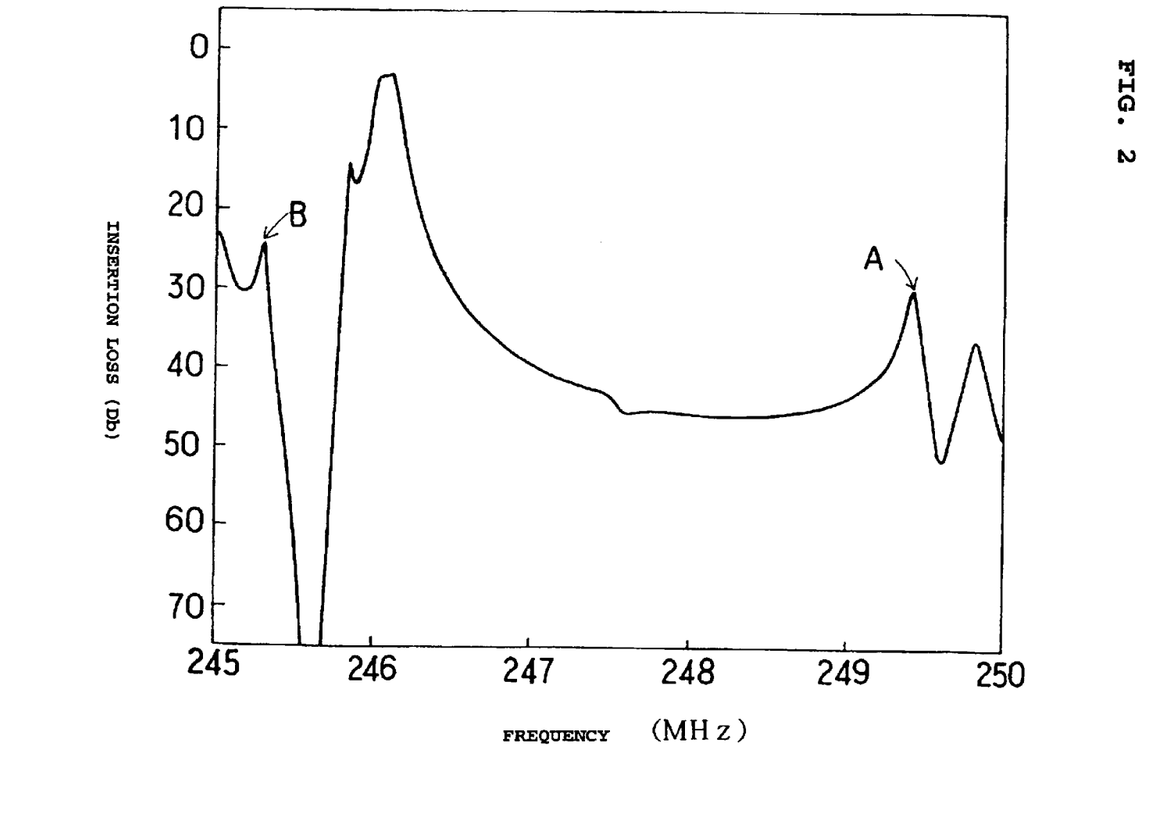
FIG. 2 shows the filtering characteristics of a longitudinally coupled surface acoustic wave resonator filter according to another preferred embodiment of the present invention.

The filtering characteristics of a longitudinally coupled surface acoustic wave resonator filter 1 according to another preferred embodiment are shown in FIG. 2. In the surface acoustic wave resonator filter 1, the dimension of the quartz substrate preferably is approximately 5.5 mm×1.2 mm×0.4 mm, the number of pairs of electrode fingers is 150 in the IDTs 3 and 4, the electrode fingers are 100 in the reflectors 5 and 8, the distance $L_1$ is about 0.35λ, and the distance $L_2$ is about 0.55λ.

As clearly understood in FIG. 2, in contrast to the response in the passband of about 245.92 MHz to about 246.08 MHz, spurious output A appearing in the band of about 249 MHz to about 250 MHz is greatly reduced and minimized when compared with the filtering characteristics shown in FIG. 8.

The reason why spurious output A can be minimized by setting the distances $L_1$ and $L_2$ as in the above is described.

In either of the resonance mode forming the passband and the resonance mode causing spurious output, the response in each vibration mode is based on the standing wave generated by the vibration confined between the reflectors 5 and 6. Therefore, the period of the standing wave becomes close to about λ/2 when the period of electrode fingers of the IDT is represented by λ.

Accordingly, when the disposition of the electrode fingers of the IDTs and the reflectors 5 and 6 is changed, that is, when the location of these elements is changed along the propagation direction of a surface acoustic wave, the current flowing through the IDTs must change in accordance with the period of the standing wave. Moreover, since the period of the standing wave is slightly changed based on the resonance mode, it is considered that only the response by the resonance mode causing spurious output A may be reduced if the disposition of the IDTs 3 and 4 and the reflectors 5 and 6 is appropriate.

Figure 3:
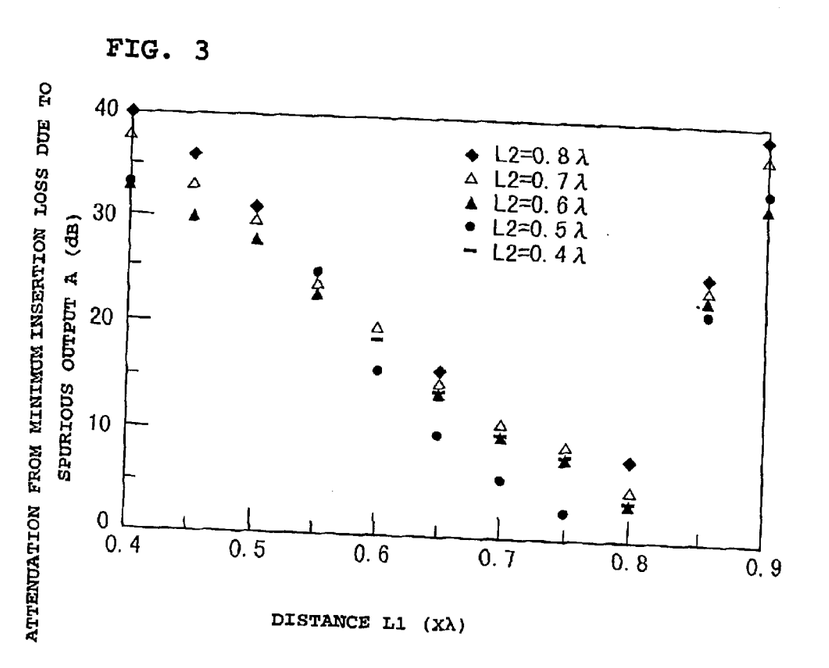
FIG. 3 shows the relationship of the attenuation from the minimum insertion loss due to spurious output at peak to the distance $L_1$ between IDTs and the distance $L_2$ between IDT and reflector in a longitudinally coupled surface acoustic wave resonator filter of the first preferred embodiment of the present invention.

In FIG. 3, the change of spurious output A is shown when the distance $L_1$ between the IDTs 3 and 4 is changed in the surface acoustic wave resonator filter 1, and the distance $L_2$ as a parameter is also changed. The vertical axis in FIG. 3 represents the attenuation (dB) from the minimum insertion loss due to spurious output A at peak. That is, the larger the attenuation is, the more the spurious output is suppressed.

Furthermore, in FIG. 3, rhombic black mark (♦) shows the result in the case of $L_2=0.8\lambda$, triangle white mark (Δ) shows the result in the case of $L_2=0.7\lambda$, triangle black mark (▲) shows the result in the case of $L_2=0.6\lambda$, round black mark (●) shows the result in the case of $L_2=0.5\lambda$, and bar mark (–) shows the result in the case of $L_2=0.4\lambda$.

As clearly understood in FIG. 3, the level of spurious output A is dependent on the distance $L_1$, and the smaller the distance $L_1$ is, the smaller spurious output A is.

Furthermore, when the distance $L_1$ becomes about 0.85λ or larger, spurious output A is reduced. This is the property shown by general surface acoustic wave elements, the distance $L_1$ has about 0.5λ periodicity, and the range in which spurious output A is reduced appears in a cycle of about 0.5λ. Based on the graph in FIG. 3, when the distance $L_1$ is in the range of approximately $(0.35+n/2)\lambda < L_2 L_1 < (0.55+n/2)\lambda$, spurious output A can be reduced.

Figure 4:
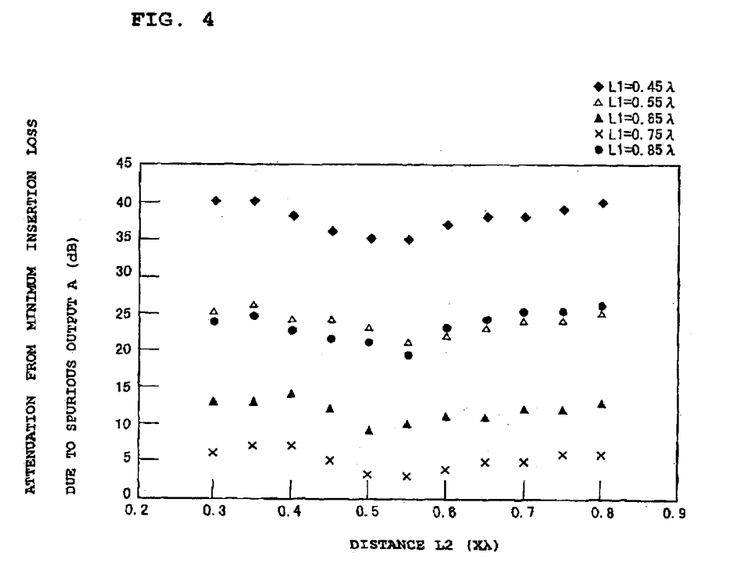
FIG. 4 shows the attenuation from the minimum insertion loss due to spurious output A at peak when the distance $L_2$ between IDT and reflector is changed while the distance $L_1$ between IDTs is considered as a parameter.

In the same way, FIG. 4 shows the change of spurious output A to the distance $L_2$, and, in FIG. 4, the distance $L_1$ is considered as a parameter. That is, FIG. 4 shows how spurious output A changes when the distance $L_2$ between the reflector and the IDT is changed. The vertical axis in FIG. 3 represents the attenuation (dB) from the minimum insertion loss due to spurious output A at peak. That is, the larger the attenuation is, the more the spurious output is suppressed.

Furthermore, in FIG. 4, rhombic black mark (♦) shows the result in the case of $L_1=0.45\lambda$, triangle white mark (Δ) shows the result in the case of $L_1=0.55\lambda$, triangle black mark (▲) shows the result in the case of $L_1=0.65\lambda$, cross mark (x) shows the result in the case of $L_1 0.75\lambda$, and round black mark (●) shows the result in the case of $L_1=0.85\lambda$.

As clearly understood in FIG. 4, the level of spurious output A is dependent on the distance $L_2$. The distance $L_2$ also has about $0.5\lambda$ periodicity which is the property of general surface acoustic wave elements, and the range in which spurious output A is reduced appears in a cycle of about $0.5\lambda$ regardless of the value of the distance $L_1$. Based on the graph in FIG. 4, when the distance $L_2$ is in the range of approximately $(0.10+m/2)\lambda<L_2<(0.40+m/2)\lambda$, spurious output A can be reduced.

That is, based on the result in FIGS. 3 and 4, in order to suppress only the response of resonance modes causing spurious output A, the distance $L_1$ and the distance $L_2$ may be set so as to satisfy the above equations (1) and (2).

Accordingly, in the longitudinally coupled surface acoustic wave resonator filter 1, since the distances $L_1$ and $L_2$ are set so as to satisfy the equations (1) and (2), spurious output A can be effectively suppressed as shown in FIG. 2.

Figure 5:
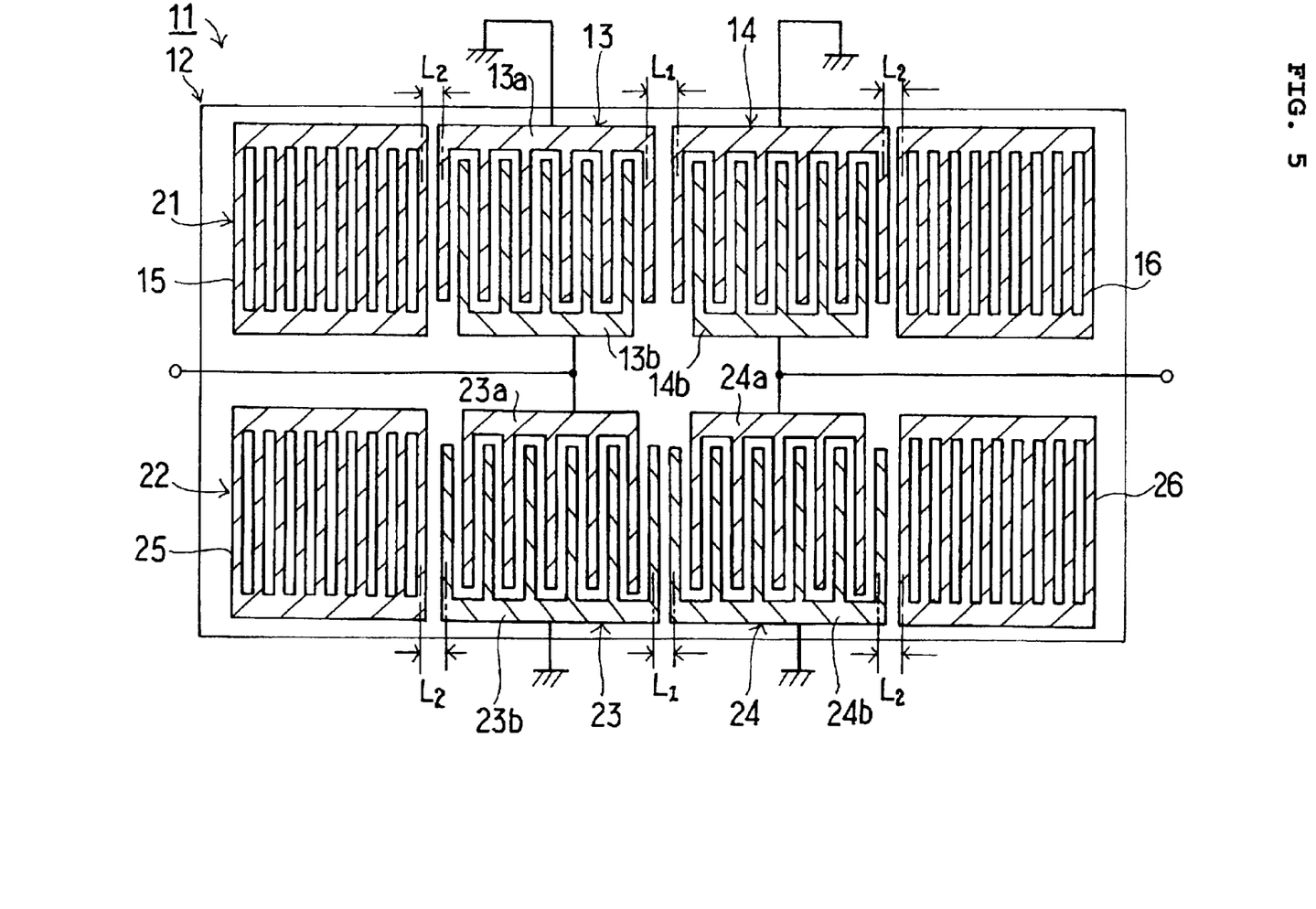
FIG. 5 is a top view of a longitudinally coupled surface acoustic wave resonator filter according to a second preferred embodiment of the present invention.

FIG. 5 is a top view of a longitudinally coupled surface acoustic wave resonator filter according to a second preferred embodiment of the present invention.

In the longitudinally coupled surface acoustic wave resonator filter 11 of the present preferred embodiment, two of the longitudinally coupled surface acoustic wave resonator filters 1 of the first preferred embodiment described above are disposed on the same quartz substrate 12. However, the characteristics of the two surface acoustic wave resonator filters are different from each other.

Hereinafter, the two longitudinally coupled surface acoustic wave resonator filters are referred to as first and second surface acoustic wave resonator filter portions 21 and 22.

First and second IDTs 13 and 14 are disposed in the middle area of the quartz substrate 12 to constitute the first longitudinally coupled surface acoustic wave resonator filter portion 21. Reflectors 15 and 16 are disposed on both sides of the first and second IDTs 13 and 14 in the propagation direction of a surface acoustic wave.

Furthermore, beside the first longitudinally coupled surface acoustic wave resonator filter portion 21, first and second IDTs 23 and 24 are arranged along the propagation direction of a surface acoustic wave to constitute the second longitudinally coupled surface acoustic wave resonator filter portion 22. Reflectors 25 and 26 are disposed on both sides of the area where the first and second IDTs 23 and 24 are provided.

The input and output sides of the first and second longitudinally coupled surface acoustic wave resonator filter portions 21 and 22 are electrically connected in parallel, respectively. That is, the comb-shaped electrodes 13b and 23b of the IDTs 13 and 23 are connected together. In the same way, the comb-shaped electrodes 14b and 24a of the IDTs 14 and 24 are connected together to constitute an output terminal. Moreover, the comb-shaped electrodes 13a, 14a, 23b, and 24b are grounded.

As described above, the first and second longitudinally coupled surface acoustic wave resonator filter portions 21 and 22 are constructed in the same way as the longitudinally coupled surface acoustic wave resonator filter 1, respectively.

However, the first longitudinally coupled surface acoustic wave resonator filter portion 21 and the second longitudinally coupled surface acoustic wave resonator filter portion 22 have different bandpass characteristics from each other, and thus wide band characteristics are fulfilled.

In addition, since the first and second longitudinally coupled surface acoustic wave resonator filter portions 21 and 22 are constructed so that the distances $L_1$ and $L_2$ satisfy equations (1) and (2) in the same way as in the first preferred embodiment, unnecessary spurious output can be effectively reduced. This is described with reference to FIGS. 6 and 7.

Now, for comparison purposes, a filter is constructed in the same way as the longitudinally coupled surface acoustic wave resonator filter 11 where, in the first longitudinally coupled surface acoustic wave resonator filter portion 21, the distances $L_1$ and $L_2$ are set to be about $0.96\lambda$ and about $0.62\lambda$, respectively, and, in the second longitudinally coupled surface acoustic wave resonator filter portion 22, the distances $L_1$ and $L_2$ are set to be about $0.63\lambda$ and about $0.80\lambda$, respectively. In this case, because of n, m=1, the first longitudinally coupled surface acoustic wave resonator filter portion 21 satisfies equations (1) and (2), but the second longitudinally coupled surface acoustic wave resonator filter portion 22 does not satisfy equation (1).

The filtering characteristics of the longitudinally coupled surface acoustic wave resonator filter prepared as described above is shown in FIG. 6.

Figure 6:
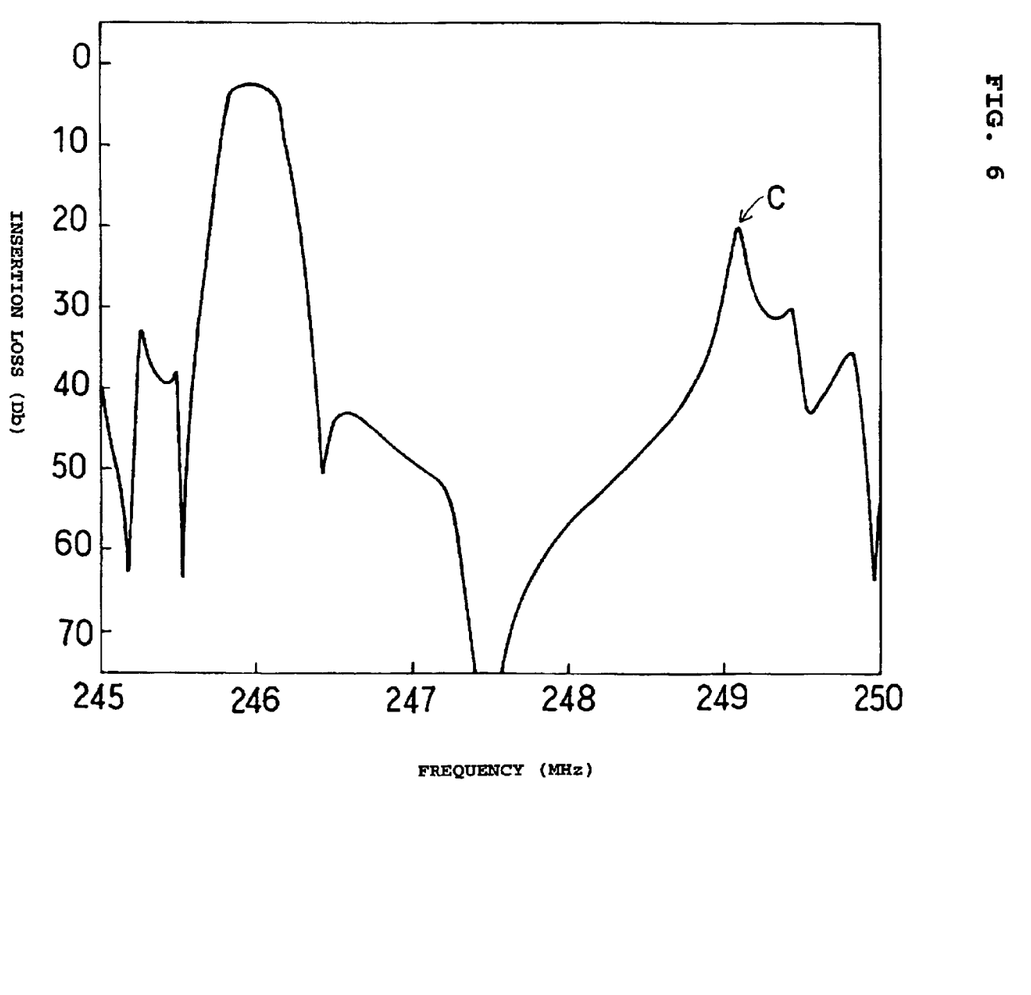
FIG. 6 shows the filtering characteristics of a surface acoustic wave resonator filter in which two longitudinally coupled surface acoustic wave resonator filters are connected in parallel and one of the two filters does not satisfy equations (1) and (2)

As is clear in FIG. 6, a large spurious output is shown by an arrow C. This occurs because, since the second longitudinally coupled surface acoustic wave resonator filter portion 22 does not satisfy equation (1), the large spurious output A shown in FIG. 8 also appears in the surface acoustic wave filter in which the two elements are connected in parallel.

On the other hand, a longitudinally coupled surface acoustic wave resonator filter according to the second preferred embodiment is constructed. In the first surface acoustic wave resonator filter portion 21, the distances $L_1$ and $L_2$ are preferably about $0.93\lambda$ and about $0.63\lambda$, respectively, and, in the second surface acoustic wave resonator filter portion 22, the distances $L_1$ and $L_2$ are preferably about $0.51\lambda$ and about $0.80\lambda$, respectively. That is, both the first and second surface acoustic wave resonator filter portions 21 and 22 are constructed so as to satisfy equations (1) and (2). The filtering characteristics of the longitudinally coupled surface acoustic wave resonator filter 11 of the second preferred embodiment are shown in FIG. 7.

Figure 7:
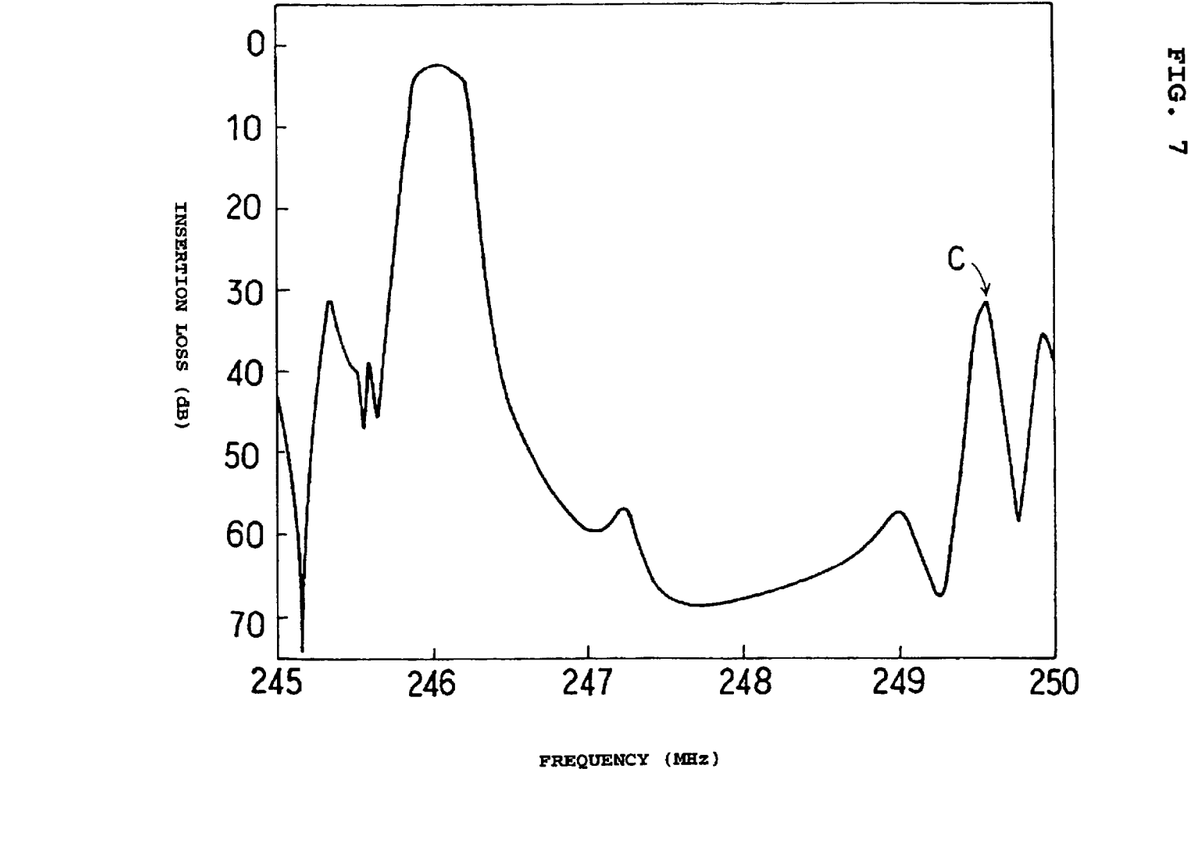
FIG. 7 shows the filtering characteristics of the longitudinally coupled surface acoustic wave resonator filter according to a second preferred embodiment of the present invention.

As is clear in FIG. 7, in the longitudinally coupled surface acoustic wave resonator filter 11 where the first and second surface acoustic wave resonator filter portions 21 and 22 are connected in parallel, spurious output C is effectively reduced and minimized. That is, since the spurious output A shown in FIG. 8 is minimized in both the longitudinally coupled surface acoustic wave resonator filter portions 21 and 22, the suppress spurious output C can be minimized.

Although the first and second IDTs 3, 4, 13, 14, 23, and 24 are disposed in the propagation direction of a surface acoustic wave in the above-described preferred embodiments, three or more IDTs may be provided.

In a longitudinally coupled surface acoustic wave resonator filter according to preferred embodiments of the present invention, since the distance $L_1$ between the centers of the electrode fingers, which are the closest to each other, of adjacent IDTs is selected so as to meet equation (1) and the distance $L_2$ between the center of the innermost electrode fingers of reflectors and the center of the outermost electrode fingers of IDTs adjacent reflectors is selected so as to satisfy equation (2), unnecessary spurious output appearing on the high-frequency side of the passband can be effectively suppressed and minimized. Accordingly, a longitudinally coupled surface acoustic wave resonator filter including a quartz substrate excellent in the temperature stability and having excellent filtering characteristics without practically increasing insertion loss can be provided. Therefore, bandpass filters which are appropriate for the IF filter in mobile communication systems and are able to easily cope with digitization of communication systems can be provided.

In a longitudinally coupled surface acoustic wave resonator filter according to preferred embodiments of the present invention, since two of the above-described surface acoustic wave resonator filters of preferred embodiments of the present invention, which are different in bandpass characteristics from each other, are disposed on the same quartz substrate and these inputs and outputs are electrically connected in parallel, a wide band bandpass filter can be provided. In addition, since both the longitudinally coupled surface acoustic wave resonator filters are constructed so as to satisfy equations (1) and (2), spurious output on the high-frequency side of the passband is effectively suppressed and minimized. Accordingly a wideband bandpass filter having excellent filtering characteristics, in which unnecessary spurious output is suppressed and minimized, can be provided.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A longitudinally coupled surface acoustic wave resonator filter comprising:

a quartz substrate;

a plurality of interdigital transducers including electrodes fingers, the plurality of interdigital transducers being arranged along a propagation direction of a surface acoustic wave propagated on the quartz substrate; and reflectors provided on both sides of an area in which the interdigital transducers are provided, in the propagation direction of a surface acoustic wave;

wherein a distance $L_1$ between centers of the electrode fingers which are closest to each other, of adjacent interdigital transducers is about $0.35\lambda$;

wherein a distance $L_2$ between the center of the innermost electrode fingers of the reflectors and the center of the outermost electrode fingers of the interdigital transducers adjacent to the reflectors is about $0.55\lambda$; and wherein the number of pairs of electrode fingers is 150 in the interdigital transducers.

2. A longitudinally coupled surface acoustic wave resonator filter comprising two sets of a longitudinally coupled surface acoustic wave resonator filter as claimed in claim 1, said two sets of the filters having different characteristics from each other, and being provided on the same quartz substrate, wherein the inputs and outputs of the two filters are electrically connected in parallel, respectively.

3. A longitudinally coupled surface acoustic wave resonator filter as claimed in claim 2, wherein said two sets of longitudinally coupled surface acoustic wave resonator filters have different bandpass characteristics from each other.

4. A longitudinally coupled surface acoustic wave resonator filter as claimed in claim 1, wherein the quartz substrate is substantially rectangular.

5. A longitudinally coupled surface acoustic wave resonator filter as claimed in claim 1, wherein the reflectors are grating reflectors.

6. A longitudinally coupled surface acoustic wave resonator filter as claimed in claim 1, wherein said plurality of interdigital transducers constitute first and second interdigital transducers.

7. A longitudinally coupled surface acoustic wave resonator filter as claimed in claim 1, wherein a dimension of the quartz substrate is approximately 5.5 mm×1.2 mm×0.4 mm.

8. A longitudinally coupled surface acoustic wave resonator filter comprising:

a quartz substrate;

a plurality of interdigital transducers including electrodes fingers, the plurality of interdigital transducers being arranged along a propagation direction of a surface acoustic wave propagated on the quartz substrate; and reflectors provided on both sides of an area in which the interdigital transducers are provided, in the propagation direction of a surface acoustic wave;

wherein a distance $L_1$ between centers of the electrode fingers which are closest to each other, of adjacent interdigital transducers is about $0.35\lambda$;

wherein a distance $L_2$ between the center of the innermost electrode fingers of the reflectors and the center of the outermost electrode fingers of the interdigital transducers adjacent to the reflectors is about $0.55\lambda$; and wherein the number of electrode fingers is 100 in the reflectors.

9. A longitudinally coupled surface acoustic wave resonator filter as claimed in claim 8, wherein said plurality of interdigital transducers constitute first and second interdigital transducers.

10. A longitudinally coupled surface acoustic wave resonator filter as claimed in claim 8, wherein a dimension of the quartz substrate is approximately 5.5 mm×1.2 mm×0.4 mm.

11. A longitudinally coupled surface acoustic wave resonator filter comprising two sets of a longitudinally coupled surface acoustic wave resonator filter as claimed in claim 8, said two sets of the filters having different characteristics from each other, and being provided on the same quartz substrate, wherein the inputs and outputs of the two filters are electrically connected in parallel, respectively.

12. A longitudinally coupled surface acoustic wave resonator filter as claimed in claim 11, wherein said two sets of longitudinally coupled surface acoustic wave resonator filters have different bandpass characteristics from each other.

13. A longitudinally coupled surface acoustic wave resonator filter as claimed in claim 8, wherein the quartz substrate is substantially rectangular.

14. A longitudinally coupled surface acoustic wave resonator filter as claimed in claim 8, wherein the reflectors are grating reflectors.

* * * * *